(12) United States Patent
Inoue

(10) Patent No.: US 7,696,810 B2
(45) Date of Patent: Apr. 13, 2010

(54) REFERENCE CURRENT SOURCE CIRCUIT AND INFRARED SIGNAL PROCESSING CIRCUIT

(75) Inventor: Takahiro Inoue, Katsuragi (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 96 days.

(21) Appl. No.: 12/013,788

(22) Filed: Jan. 14, 2008

(65) Prior Publication Data
US 2008/0169861 A1    Jul. 17, 2008

(30) Foreign Application Priority Data
Jan. 16, 2007  (JP)  ............................. 2007-007498

(51) Int. Cl.
*H01H 85/00* (2006.01)
(52) U.S. Cl. ..................................... 327/525
(58) Field of Classification Search ................ 327/524, 327/525, 526, 334, 530
See application file for complete search history.

(56) References Cited

U.S. PATENT DOCUMENTS 6,169,393 B1 *  1/2001  Hashimoto ................. 323/354
6,462,609 B2 *  10/2002 Hashimoto et al. .......... 327/525
7,242,239 B2 *  7/2007  Hanson et al. .............. 327/525
7,514,982 B2 *  4/2009  Warner ....................... 327/525

FOREIGN PATENT DOCUMENTS

| JP | 61-114319 A | 6/1986 |
| JP | 3-4187 A | 1/1991 |
| JP | 2000-340656 A | 12/2000 |
| JP | 2002-26131 A | 1/2002 |

* cited by examiner

*Primary Examiner*—Hai L Nguyen
(74) *Attorney, Agent, or Firm*—Birch, Stewart, Kolasch & Birch, LLP

(57) ABSTRACT

The reference current source circuit (10) is provided with a current source circuit (1), a trimming fuse (3), a switching circuit (2) which connects/disconnects the current source circuit (1) and/from the trimming fuse (3), a NAND circuit (4) which controls the operation of the switching circuit (2), and a pull-down resistor (R1) which connects one input terminal of the NAND circuit (4) to a GND terminal. The NAND circuit (4) controls the operation of the switching circuit (2) upon receipt of control signals (S1 and S2) and also in accordance with a signal of the one input terminal of the NAND circuit (4) so as to connect the current source circuit (1) to the trimming fuse (3). This arrangement makes it possible to measure characteristics of a semiconductor integrated circuit after fuse trimming. In addition, it is possible to maintain the state after fuse trimming without the supply of a signal from outside. Moreover, a reference current source circuit which does not consume extra consumption current is realized.

4 Claims, 10 Drawing Sheets

REFERENCE CURRENT SOURCE CIRCUIT AND INFRARED SIGNAL PROCESSING CIRCUIT

This nonprovisional application claims priority under 35 U.S.C. § 119(a) on Patent Application No. 007498/2007 filed in Japan on Jan. 16, 2007, the entire contents of which are hereby incorporated by reference.

FIELD OF THE INVENTION

The present invention relates to a reference current source circuit which adjusts characteristics of a semiconductor integrated circuit by fuse trimming.

BACKGROUND OF THE INVENTION

Fuse trimming for trimming a reference current with a fuse has been performed heretofore in order to obtain intended characteristics, regardless of characteristic unevenness due to increasing production unevenness of semiconductor integrated circuits along with miniaturization thereof.

FIG. 10 illustrates a reference current source circuit 105 having a fuse 101 and a current source circuit 102 for fuse trimming.

With the reference current source circuit 105, it is readily understood that a state of a semiconductor integrated circuit after disconnection of the fuse 101 cannot be measured before disconnection of the fuse 101. Therefore, it is necessary to measure characteristic unevenness of the semiconductor integrated circuit by other method in order that a state after disconnection of the fuse 101 may be predicted.

For measuring characteristic unevenness of a semiconductor integrated circuit, there is a method with a monitoring device including a resistor and capacitor formed on a wafer. In this method, it is possible to predict a state after disconnection of a fuse by measuring the characteristic unevenness of the resistor and the capacitor of the monitoring device.

However, some errors would be observed in this method in comparison with an actual state obtained after disconnection of the fuse because the method is ultimately for prediction. In addition, it is impossible to consider in-plane characteristic unevenness of the wafer because only a few monitoring devices are normally provided on the wafer. Furthermore, it is impossible to detect subtle characteristic errors caused due to a mismatch of elements. Accordingly, chances of incorrect fuse trimming are high in a case where fuse trimming is performed with the reference current source circuit 105. A product actually becomes defective due to such incorrect fuse trimming.

FIG. 11 schematically illustrates a structure of a MOS analog integrated circuit shown in Publication 1 (Japanese Unexamined Patent Publication: Tokukaisho 61-114319 (published on Jun. 2, 1986)).

In the MOS analog integrated circuit, a bias voltage is supplied with an analog circuit A by controlling a switch SW which is a MOS transistor of a bias circuit B according to a control signal C which is supplied from a control circuit D and whose level becomes high in response to disconnection of a fuse. In the MOS analog integrated circuit with this structure a state after disconnection of the fuse can be measured before disconnection of the fuse, not by disconnection of the fuse, but by feeding the control signal C at H level.

However, this structure has a problem in that extra consumption current is consumed because extra current Ix flows through a resistor Rx when fuse trimming is completed without disconnection of the fuse.

FIG. 12 illustrates a fuse trimming circuit shown in Publication 2 (Japanese Unexamined Patent Publication: Tokukaihei 3-4187 (published on Jan. 10, 1991)). Table 1 describes the operation of this fuse trimming circuit.

TABLE 1

| ENABLE | CONTROL SIGNAL D | SW1 | SW2 | |
|---|---|---|---|---|
| 0 | — | ON | OFF | NORMAL MODE |
| 1 | 0 | OFF | ON | TEST MODE: FUSE NOT DISCONNECTED |
| 1 | 1 | OFF | OFF | TEST MODE: FUSE DISCONNECTED |

As shown in "test mode" in Table 1, by controlling switches SW1 and SW2 with an Enable signal and a control signal D, the fuse trimming circuit above can be measured as to its state with disconnection of the fuse and a state without disconnection of the fuse, that is, the state after fuse trimming. For the structure above, however, two switching circuits are required and thus this causes a problem in that the number of circuit elements increases. In addition, the structure above also has a problem in that the Enable signal needs to be always supplied from outside in order to maintain the state of normal operation.

SUMMARY OF THE INVENTION

In view of the problems above, an object of the present invention is to realize a reference current source circuit, a circuit for performing fuse trimming which makes it possible to measure characteristics of a semiconductor integrated circuit after fuse trimming, maintain the state after fuse trimming without the supply of a signal from outside, and consume no extra consumption current and an infrared signal processing circuit therewith.

In order to attain the object above, a reference current source circuit of the present invention is a circuit for performing fuse trimming, comprising: a current source circuit; a trimming fuse; a switching circuit for connecting the current source circuit to the trimming fuse upon receipt of an inputted signal at a predetermined level, and disconnecting the current source circuit from the trimming fuse upon receipt of an inputted signal at a different level from the predetermined level; a control circuit including a plurality of input terminals, for controlling the operation of the switching circuit by generating a signal at the predetermined level or the different level from the predetermined level in accordance with a test control signal inputted into the plurality of input terminals and inputting the generated signal into the switching circuit; and a resistive element connecting at least one of the plurality of input terminals of the control circuit to a positive current source terminal or a negative current source terminal, the control circuit controlling the operation of the switching circuit by generating the signal at the predetermined level in accordance with a signal of the input terminal connected to the resistive element.

According to the arrangement above, the reference current source circuit of the present invention can change the connection status of the current source circuit and the trimming fuse under the control of the switching circuit by the input of the test control signal for measuring characteristics of a semiconductor integrated circuit after fuse trimming into the control circuit. With this, a state after fuse trimming can be measured. As a result, it is possible to perform correct fuse trimming and thus improve a nondefective ratio.

According to the arrangement above, in the reference current source circuit, at least one of the input terminals of the control circuit is connected to the positive current source terminal or the negative current source terminal by the resistive element. The control circuit can control the switching circuit so as to connect the current source circuit to the trimming fuse in accordance with a signal of the input terminal connected to the resistive element. This makes it possible to maintain the state after fuse trimming without the supply of a signal from outside.

According to the arrangement above, no extra consumption current is consumed after fuse trimming because electric current does not flow into the resistive element while the test control signal is not inputted.

With the arrangement above with which characteristics of a semiconductor integrated circuit after fuse trimming can be measured, the state after fuse trimming can be maintained without the supply of a signal from outside, and thus a reference current source circuit which consumes no extra consumption current can be realized.

A resistor element or a MOS transistor can be used for the resistive element above. In the case of the MOS transistor, manufacturing becomes easy and cost reduction becomes possible.

In order to attain the object above, an infrared signal processing circuit of the present invention is provided with the reference current source circuit and a circuit which is fuse-trimmed by the reference current source circuit.

According to the arrangement above, the infrared signal processing circuit of the present invention has an effect which correct fuse trimming is performed and a nondefective ratio is improved because the infrared signal processing circuit is provided with the reference current source circuit and the circuit which is fuse-trimmed by the reference current source circuit.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 6 (b) is a waveform chart of outputs of a band-pass filter circuit and a carrier detector circuit of the infrared remote control receiver.

FIG. 6 (c) is a waveform chart of an output of an integrating circuit of the infrared remote control receiver.

FIG. 6 (d) is a waveform chart of an output of the infrared remote control receiver.

DESCRIPTION OF THE EMBODIMENTS

Embodiment 1

Embodiment 1 of the present invention is described below with reference to FIG. 1 and Table 2.

Figure 1:
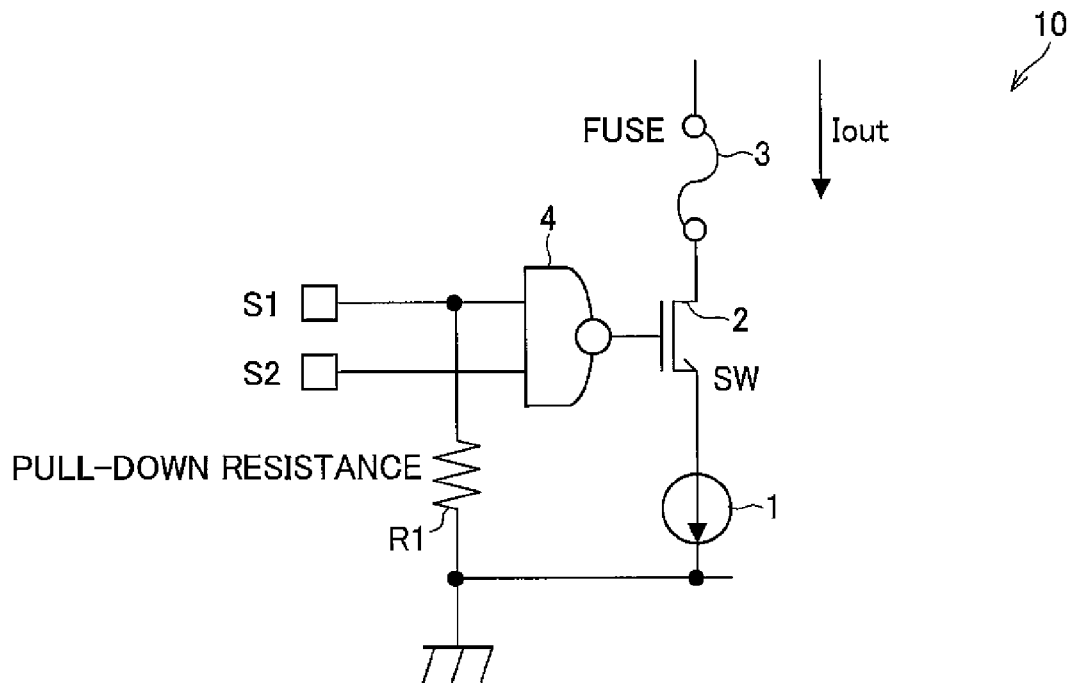
FIG. 1 is a circuit diagram of a reference current source circuit of one embodiment.

FIG. 1 illustrates a circuitry of a reference current source circuit 10 which adjusts characteristics of a semiconductor integrated circuit by fuse trimming.

The reference current source circuit 10 is provided with a current source circuit 1, a switching circuit (SW) 2, a trimming fuse 3 (hereafter the fuse), a NAND circuit 4 (a control circuit), and a pull-down resistor R1 (a resistive element).

The switching circuit 2 is an N-channel MOS transistor and has a function of connecting/disconnecting the current source circuit 1 to/from the fuse 3. A drain of the MOS transistor is connected to an internal circuit of a semiconductor integrated circuit (not illustrated) via the fuse 3. A source of the MOS transistor is connected to a GND terminal via the current source circuit 1. A gate of the MOS transistor is connected to an output terminal of the NAND circuit 4.

The NAND circuit 4 has a function of controlling the operation of the switching circuit 2. The NAND circuit 4 receives a control signal S1 (a test control signal) from outside at one input terminal thereof, and a control signal S2 (a test control signal) from outside at the other input terminal thereof. The one input terminal of the NAND circuit 4 is connected to the GND terminal via the pull-down resistor R1 and pulled down to GND level.

This configuration enables the reference current source circuit 10 to measure characteristics of the semiconductor integrated circuit after fuse trimming. A measuring operation of the reference current source circuit 10 is described below.

Table 2 shows the operation of the reference current source circuit 10. In the table, "normal mode" means a case of the normal operation of a semiconductor integrated circuit after fuse trimming; "test mode" means a case of characteristic measurement of a semiconductor integrated circuit before fuse trimming.

TABLE 2

| S1 | S2 | SW | |
|----|----|-----|---|
| — | — | ON | NORMAL MODE |
| 1 | 0 | ON | TEST MODE: FUSE NOT DISCONNECTED |
| 1 | 1 | OFF | TEST MODE: FUSE DISCONNECTED |

In the test mode, as described in the table, on/off control of the switching circuit 2 is controlled by inputting the control signal S1 at H level ("1" in the table) into the one input terminal of the NAND circuit 4 and also inputting the control signal S2 at H or L level ("0" in the table) into the other input terminal of the NAND circuit 4. This makes it possible to measure characteristics of a semiconductor integrated circuit after fuse trimming, that is, before and after disconnection of the fuse 3. Specifically, the characteristics of the semiconductor integrated circuit before disconnection of the fuse 3 can be measured because the switching circuit 2 is turned on upon output of a signal at H level (predetermined level) from the NAND circuit 4 in response to the input of the control signal S2 at L level. On the other hand, characteristics of the semiconductor integrated circuit after disconnection of the fuse 3 can be measured because the switching circuit 2 is turned off upon output of a signal at L level (different level from the predetermined level) from the NAND circuit 4 in response to the input of the control signal S2 at H level.

In the normal mode, the switching circuit 2 is always on because the control signals S1 and S2 are not inputted and the one input terminal of the NAND circuit 4 is pulled down to GND level. Thus, in the normal mode, the state of normal operation is maintained with the switching circuit 2 kept on without the supply of any signal from outside. No extra consumption current is consumed because current does not flow into the pull-down resistor R1.

As described above, characteristics of a semiconductor integrated circuit after fuse trimming can be measured with the reference current source circuit 10, the characteristic including influences from subtle errors such as in-plane characteristic unevenness of a wafer and a mismatch of elements. This makes it possible to perform correct fuse trimming and improve a nondefective ratio. Furthermore, after fuse trimming, the state of the reference current source circuit 10 after fuse trimming can be maintained without the supply of a signal from outside and does not consume extra consumption current.

Embodiment 2

Embodiment 2 of the present invention is described below with reference to FIG. 2. Here, descriptions for members, signals, etc. given the same symbols as the embodiment 1 are not repeated because functions thereof are the same. Only a different point from the reference current source circuit 10 is described here.

Figure 2:
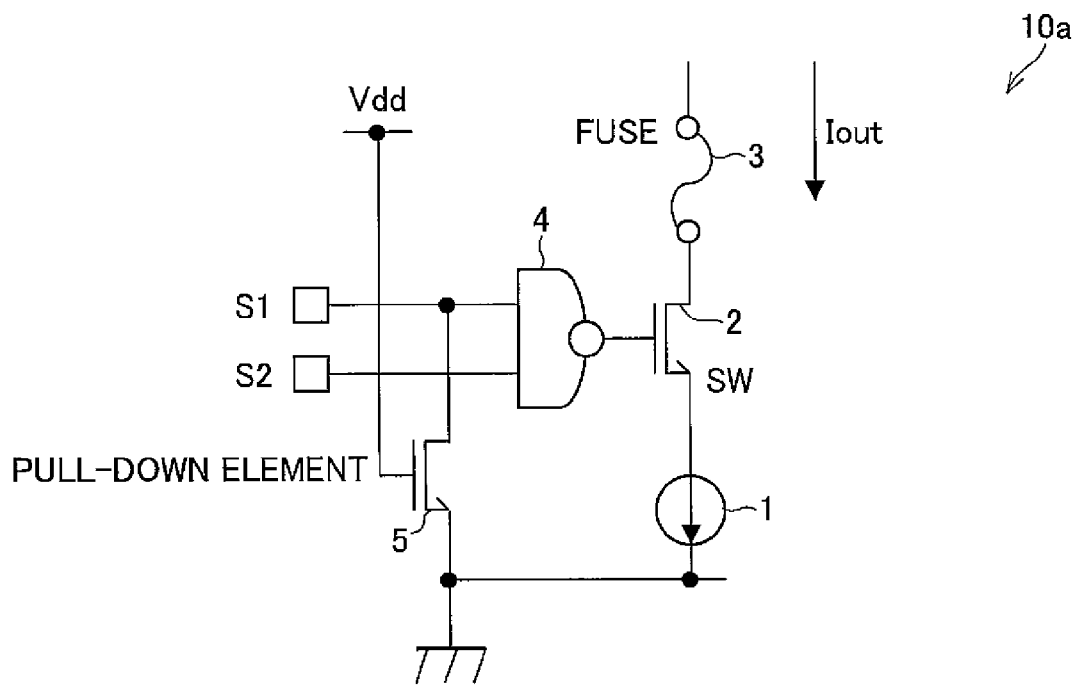
FIG. 2 is a circuit diagram of a reference current source circuit of another embodiment.

FIG. 2 illustrates a circuitry of a reference current source circuit 10a which adjusts characteristics of a semiconductor integrated circuit by fuse trimming.

A difference between the reference current source circuit 10a and the reference current source circuit 10 is that the reference current source circuit 10a is provided with a pull-down element (a resistive element) 5 instead of the pull-down resistor R1. The pull-down element 5 is an N-channel MOS transistor. A drain of the MOS transistor is connected to one input terminal of a NAND circuit 4. A source of the MOS transistor is connected to a GND terminal. A gate of the MOS transistor is connected to a current source terminal. The MOS transistor operates in a linear region.

Thus, with regard to the reference current source circuit 10a in which the pull-down resistor R1 is a MOS transistor, it is possible to use the MOS transistors for all parts except the fuse 3. The reference current source circuit 10a can be manufactured with easy and low cost.

Embodiment 3

Embodiment 3 of the present invention is described below with reference to FIG. 3 and Table 3. Here, descriptions for members, signals, etc. given the same symbols as the embodiment 1 are not repeated because functions thereof are the same.

Figure 3:
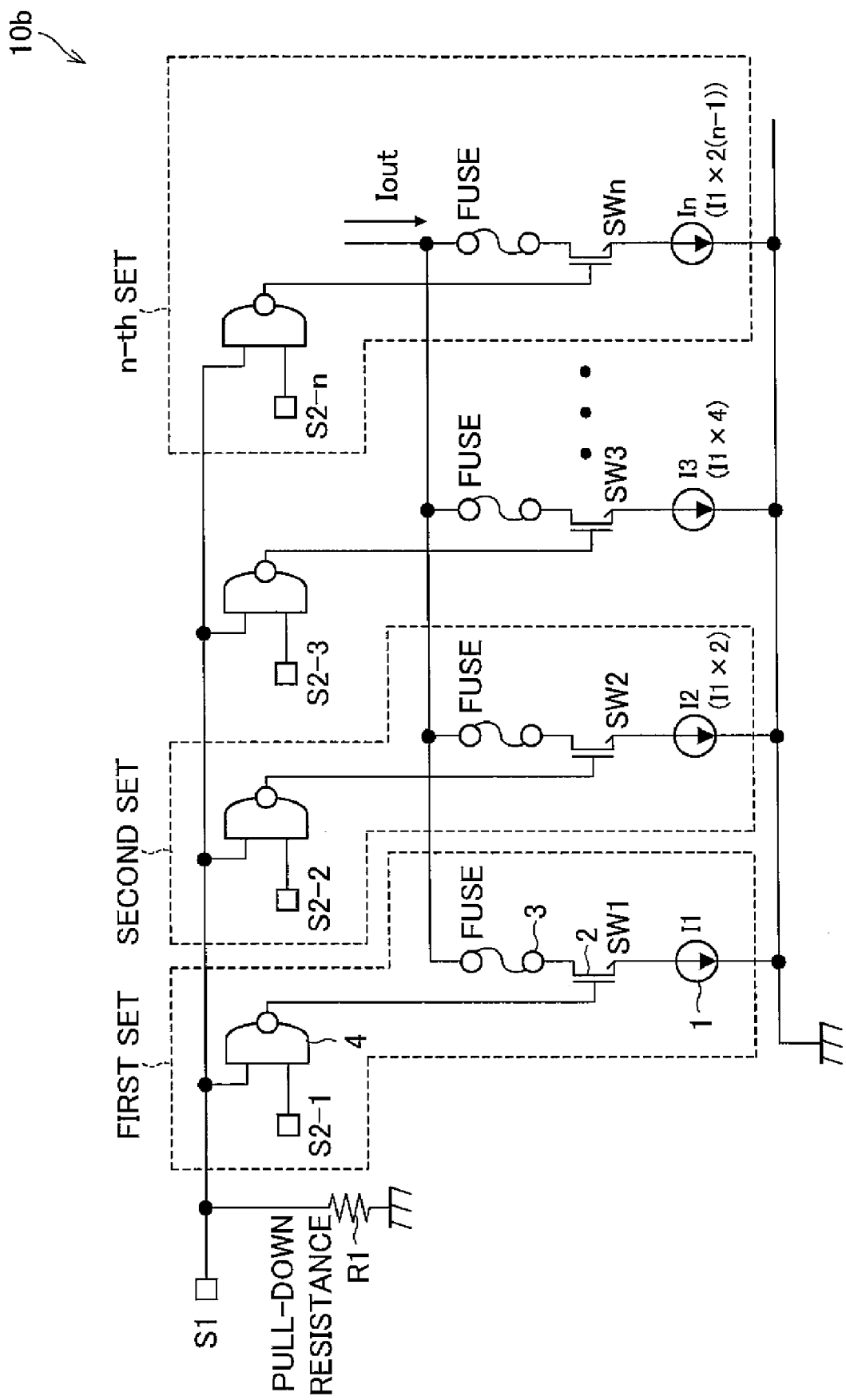
FIG. 3 is a circuit diagram of a reference current source circuit of still another embodiment.

FIG. 3 illustrates a circuitry of a reference current source circuit 10b which adjusts characteristics of a semiconductor integrated circuit by fuse trimming.

The reference current source circuit 10b includes "n" sets each of which including, as in the reference current source circuit 10, a current source circuit 1, a switching circuit 2, a fuse 3, and a NAND circuit 4. Every one input terminal of a NAND circuit 4 in the "n" set is connected to each other, so that they can receive a control signal S1 commonly. Control signals S2 (S2-1 through S2-n) are inputted into the other input terminals of the NAND circuits 4, respectively. A pull-down resistor R1 is connected to the one input terminals of the NAND circuits 4 connected each other. Therefore, the "n" sets share the one pull-down resistor R1.

Constant current values of the current source circuits 1 in the "n" sets are weighted, for instance, in such a manner that the constant current values are doubled by each set. Assume that as shown in FIG. 3, for example, the set at the far left is the first set and the adjacent set thereof is the second set, and that I1 represents a constant current value of the current source circuit 1 in the first set, and I2 represents a constant current value of the current source circuit 1 in the second set. Then, the constant current value I2 in the second set is the product of I1×2. In this case, a constant current value "In" in the "n" set is the product of I1×2(n−1).

Thus, the reference current source circuit 10b can control an output current value in a wide range with the arrangement that a plurality of current source circuits 1 whose output currents are different from each other is provided and selectable for use.

An operation of the reference current source circuit 10b is described below with reference to Table 3. Table 3 shows the operation of the reference current source circuit 10b. Note that, in the table, "normal mode" means a case of the normal operation of a semiconductor integrated circuit after fuse trimming and "test mode" means a case of characteristic measurement of a semiconductor integrated circuit before fuse trimming.

TABLE 3

| S1 | S2-1 ... S2-n | SW1 ... SWn | | CURRENT VALUE |
|---|---|---|---|---|
| — | — | ON | NORMAL MODE | |
| 1 | 000 ... 0 | ON/ON/ON ... /ON | TEST MODE: FUSE NOT DISCONNECTED | 0 |
| 1 | ... | | TEST MODE: DEPENDS ON EACH SW STATUS | $11 \times 2(n-1)$ |
| 1 | 111 ... 1 | OFF/OFF/OFF ... /OFF | TEST MODE: FUSE DISCONNECTED | |

In the test mode, as described in the table, on/off control of each of the switching circuits 2 is controlled by inputting the control signal S1 at H level ("1" in the table) into the one input terminal of each of the NAND circuits 4 and also inputting the control signal S2 at H or L level ("0" in the table) into the other input terminal of each of the NAND circuits 4. With this, characteristics of a semiconductor integrated circuit after fuse trimming, that is, before and after disconnection of each of the fuses 3 can be measured. Specifically, the characteristics of the semiconductor integrated circuit before disconnection of each of the fuses 3 can be measured if each of the switching circuits 2 is turned on by inputting the control signal S2 at L level. On the other hand, the characteristics of the semiconductor integrated circuit after disconnection of each of the fuses 3 if each of the switching circuits 2 is turned off by inputting the control signal S2 at H level. In addition, by inputting control signals S2 some of which are at H level and the others of which are at L level, it is possible to seek for an appropriate output current value.

In the normal mode, the switching circuit 2 is always on because the control signals S1 and S2 are not inputted and the one input terminal of each of the NAND circuits 4 is pulled down to GND level. Thus, it is possible to maintain the state of normal operation with each of the switching circuits 2 kept on without the supply of any signal from outside in the normal mode. No extra consumption current is consumed then because current does not flow into the pull-down resistor R1.

As described above, characteristics of a semiconductor integrated circuit after fuse trimming can be measured with the reference current source circuit 10b, the characteristics including influences from subtle errors such as in-plane characteristic unevenness on a wafer and a mismatch of elements. This makes it possible to perform correct fuse trimming and improve a nondefective ratio. In addition, it is possible to adjust characteristics of a semiconductor integrated circuit more correctly because the reference current source circuit 10b allows seeking an appropriate output current value. Furthermore, after fuse trimming, the state of the reference current source circuit 10b after fuse trimming can be maintained without the supply of a signal from outside and does not consume extra consumption current.

Embodiment 4

Embodiment 4 of the present invention is described below with reference to FIG. 4.

The switching circuit 2 is an N-channel MOS transistor in the embodiments above. However, the present invention is not limited to this, and the switching circuit 2 may be a P-channel MOS transistor. In the present embodiment, a reference current source circuit provided with a switching circuit constituted by the P-channel MOS transistor is described. Here, descriptions for members, signals, etc. given the same symbols as the embodiment 1 are not repeated because functions thereof are the same.

Figure 4:
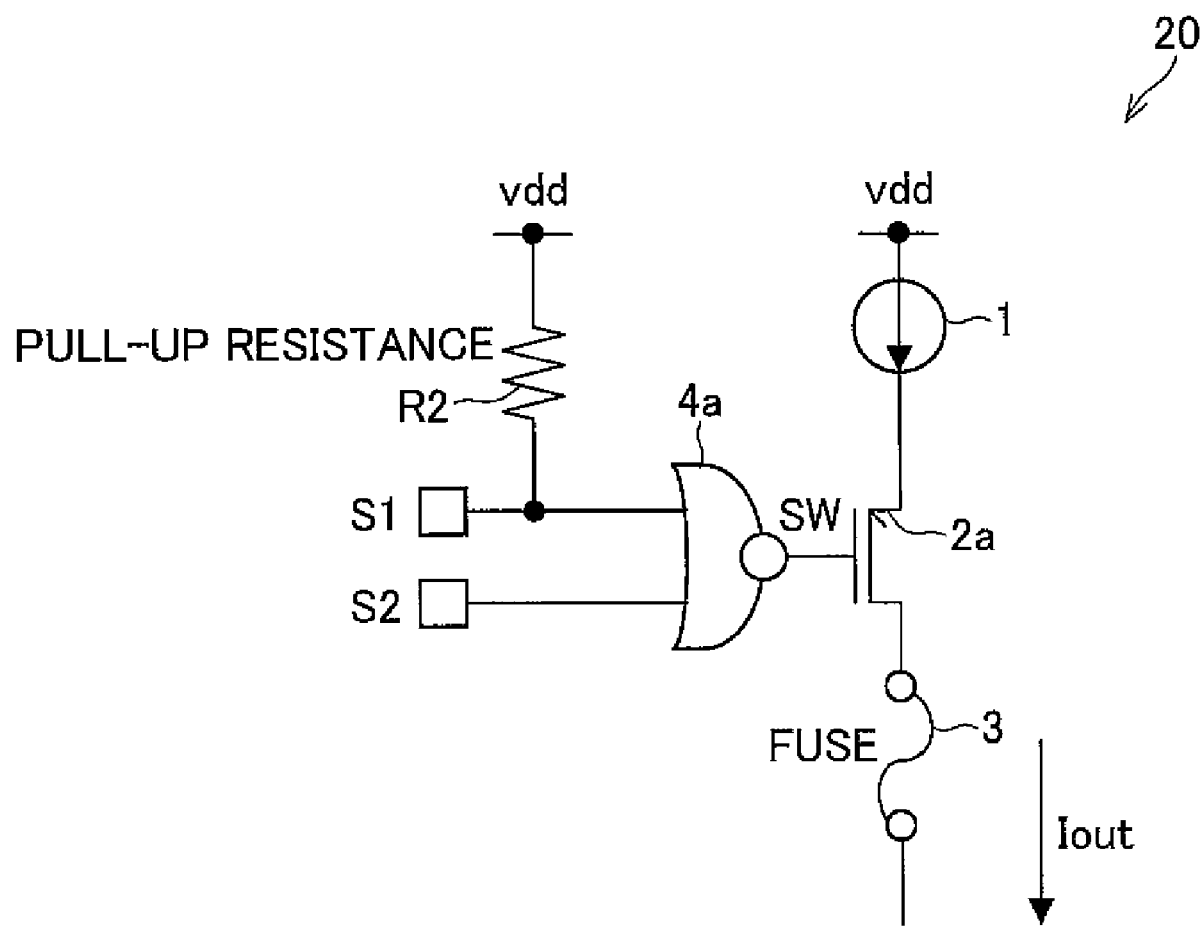
FIG. 4 is a circuit diagram of a reference current source circuit of yet another embodiment.

FIG. 4 illustrates a circuitry of a reference current source circuit 20 which adjusts characteristics of a semiconductor integrated circuit by fuse trimming.

The reference current source circuit 20 includes a current source circuit 1, a switching circuit (SW) 2a, a trimming fuse (hereafter the fuse) 3, a NOR circuit 4a, and a pull-up resistor R2.

The switching circuit 2a has a function of connecting/disconnecting the current source circuit 1 to/from the fuse 3. A drain of the MOS transistor of the switching circuit 2a is connected to an internal circuit of a semiconductor integrated circuit (not illustrated) via the fuse 3. A source of the MOS transistor is connected to a current source terminal via the current source circuit 1. The gate of the MOS transistor is connected to an output terminal of the NOR circuit 4a.

The NOR circuit 4a has a function of controlling the operation of the switching circuit 2a. A control signal S1 is inputted into one input terminal of the NOR circuit 4a from outside and a control signal S2 is inputted into the other input terminal from outside. The one input terminal of the NOR circuit 4a is connected to the current source terminal via the pull-up resistor R2 and pulled up to a current source level. With this arrangement, the reference current source circuit 20 can measure characteristics of the semiconductor integrated circuit after fuse trimming. The operation of this is described below.

Table 4 describes the operation of the reference current source circuit 20. In the table, "normal mode" means a case of the normal operation of a semiconductor integrated circuit after fuse trimming and "test mode" means a case of characteristic measurement of a semiconductor integrated circuit before fuse trimming.

TABLE 4

| S1 | S2 | SW | |
|---|---|---|---|
| — | — | ON | NORMAL MODE |
| 0 | 1 | ON | TEST MODE: FUSE NOT DISCONNECTED |
| 0 | 0 | OFF | TEST MODE: FUSE DISCONNECTED |

In the test mode, as described in the table, on/off control of the switching circuit 2a is controlled by inputting the control signal S1 at L level ("0" in the table) into the one input terminal of the NOR circuit 4a and also inputting the control signal S2 at H or L level ("0" in the table) into the other input terminal of the NOR circuit 4a. With this, characteristics of a semiconductor integrated circuit after fuse trimming, that is, before and after disconnection of the fuse 3 can be measured. Specifically, the characteristics of the semiconductor integrated circuit before disconnection of the fuse 3 can be measured because the switching circuit 2a is turned on by inputting the control signal S2 at H level. On the other hand, the characteristics of the semiconductor integrated circuit after disconnection of the fuse 3 can be measured because the switching circuit 2a is turned off by inputting the control signal S2 at L level.

In the normal mode, the switching circuit 2a is always on because the control signals S1 and S2 are not inputted and the one input terminal of the NOR circuit 4a is pulled up to the current source level. Thus, it is possible to maintain the state of normal operation with the switching circuit 2a kept on without the supply of any signal from outside in the normal mode. No extra consumption current is consumed because current does not flow into the pull-up resistor R2.

As described above, characteristics of a semiconductor integrated circuit can be measured with the reference current source circuit 20, the characteristics including influences from subtle errors such as in-plane characteristic tolerance on a wafer and a mismatch of elements after fuse trimming. This makes it possible to perform correct fuse trimming and improve a nondefective ratio. Furthermore, after fuse trimming, the reference current source circuit 20 can maintain the state after fuse trimming without the supply of a signal from outside and does not consume extra consumption current.

As in the embodiment 2, the pull-up resistor R2 may be a MOS transistor. In this case, it is possible to use MOS transistors for all parts except the fuse 3. The reference current source circuit 10a can be manufactured with easy and low cost.

Embodiment 5

Embodiment 5 of the present invention is described below with reference to FIGS. 5 to 9. The reference current source circuits described in the embodiments 1 through 4 are applicable to a variety of electronic circuits. The present embodiment exemplifies their application to an infrared signal processing circuit of an infrared remote control receiver (transmission rate: less than 1 kbps; transmission distance: 10 m or more), an IrDA Control transmitter-receiver (transmission rate: 75 kbps; transmission distance: 8 m), and the like, more specifically adjustment of a center frequency of a band-pass filter provided for the infrared remote control receiver, the IrDA Control transmitter-receiver, and the like.

Figure 5:
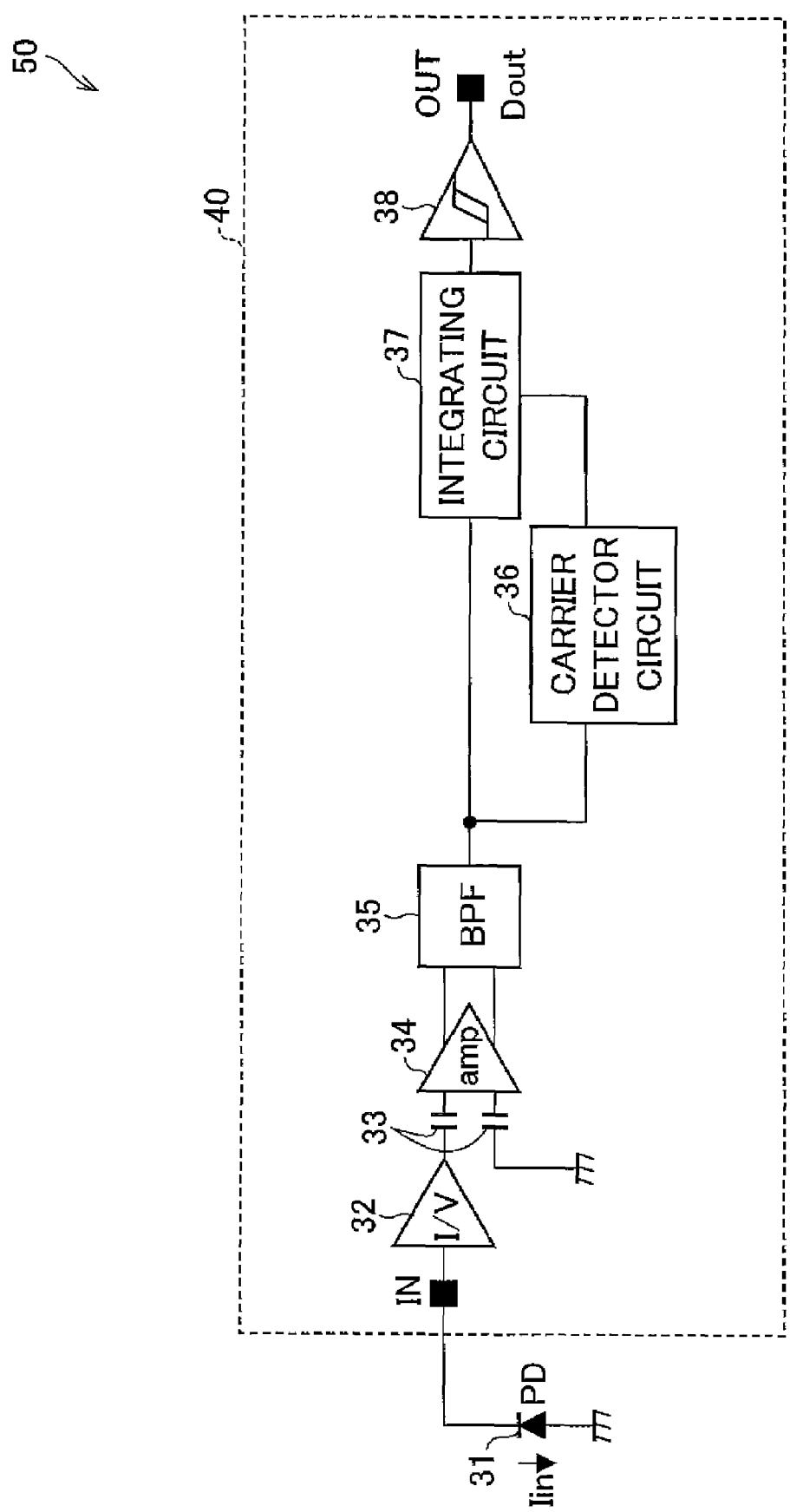
FIG. 5 is a circuit diagram of an infrared remote control receiver of still yet another embodiment.

FIG. 5 illustrates a circuitry of an infrared remote control receiver 50.

The infrared remote control receiver 50 includes a photodiode chip 31 and a receiving chip 40 having a current-voltage converter circuit 32, a capacitor 33, an amplifier circuit 34, a band-pass filter circuit (hereafter the BPF) 35, a carrier detector circuit 36, an integrating circuit 37, and a hysteresis comparator 38. In FIG. 5, an input terminal "IN" is an input terminal of the receiving chip 40, meanwhile an output terminal "OUT" is an output terminal of the receiving chip 40.

In the infrared remote control receiver 50, the photodiode chip 31 converts into a current signal Iin a remote control transmission signal sent from an infrared remote control transmitter (not illustrated). The current-voltage converter circuit 32 converts the current signal Iin into a voltage signal. The amplifier circuit 34 subsequently amplifies the voltage signal. The BPF 35 extracts carrier frequency components from the amplified voltage signal. The carrier detection circuit 36 detects a carrier in the extracted carrier frequency components. The integrating circuit 37 integrates time periods for which the carrier exists. By comparing output of the integrating circuit 37 with a threshold level, the hysteresis comparator 38 determines whether the carrier is present or not. Then, the hysteresis comparator 38 digitally outputs the result. This digital output Dout is sent to a microcomputer or the like which controls an electronic device.

Figure 6:
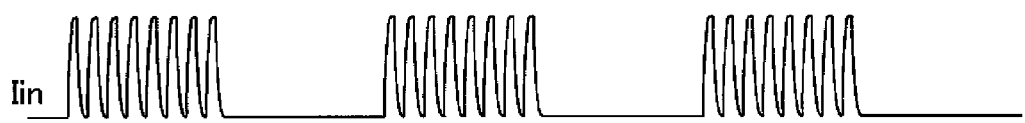
FIG. 6 (a) is a waveform chart of an output of a photodiode of the infrared remote control receiver.
Figure 6:
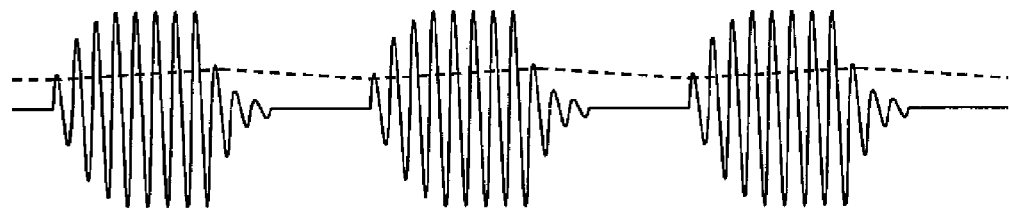
Figure 6:
Figure 6:
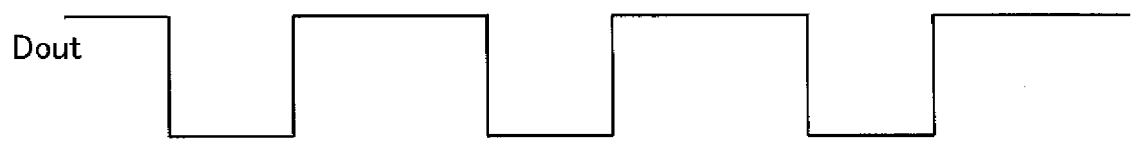

FIG. 6 illustrates the outputs of the circuits of the infrared remote control receiver 50: FIG. 6 (a) illustrates the current signal Iin; FIG. 6 (b) illustrates the output of the BPF 35 (the continuous line) and the output of the carrier detector circuit 36 (the dashed line); FIG. 6 (c) illustrates the output of the integrating circuit 37 (the continuous line); and FIG. 6 (d) illustrates the digital output Dout of the infrared remote control receiver 50. The dashed line in FIG. 6 (c) indicates the threshold level.

Figure 7:
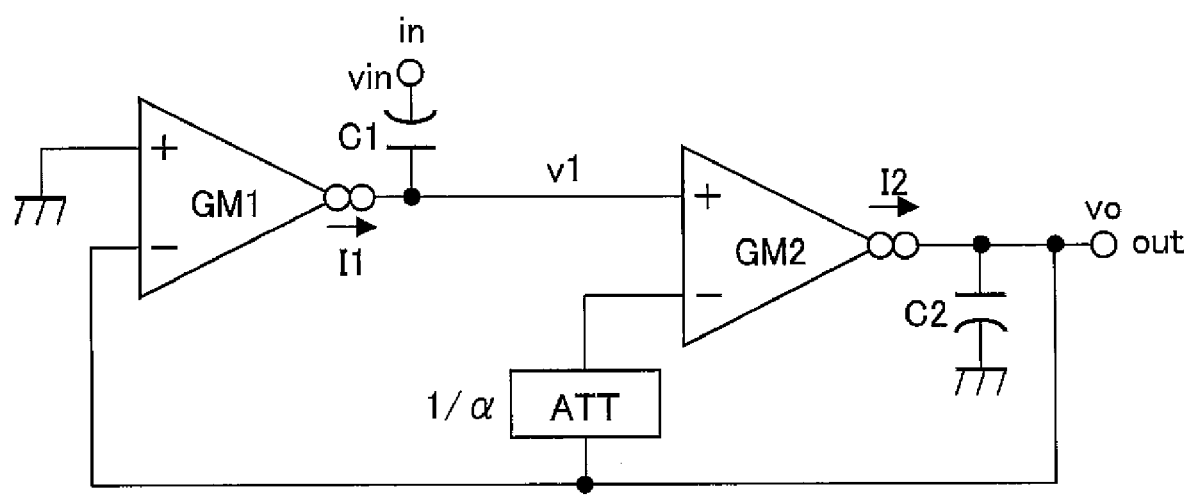
FIG. 7 is a circuit diagram of the band-pass filter circuit of the infrared remote control circuit.

FIG. 7 illustrates a circuitry of the BPF 35 concretely.

The BPF 35 is a GM-C filter provided with transconductance amplifiers GM 1 and 2, an attenuator ATT (damping ratio: 1/α), and capacitors C1 and C2. In FIG. 7, an input terminal "in" represents an input terminal "in" of the BPF 35; an output terminal "out" represents an output terminal "out" of the BPF 35 and the transconductance amplifier GM2.

A noninverting input terminal of the transconductance amplifier GM1 is connected to a GND terminal. An inverting input terminal of the transconductance amplifier GM1 is connected to the output terminal of the transconductance amplifier GM2. An output terminal of the transconductance amplifier GM1 is connected to a noninverting input terminal of the transconductance amplifier GM2 and the input terminal "in" via the capacitor C1. An inverting input terminal of the transconductance amplifier GM2 is connected to its own output terminal via the attenuator ATT. The output terminal of the transconductance amplifier GM2 is connected to the GND terminal via the capacitor C2.

The transfer function H(s) of the BPF 35 is represented by the formula (1) below.

From Kirchoff's circuit laws:

$$gm1 \times (-vo) = s \times C1 \times (v1 - vin)$$

$$gm2 \times (v1 - (R2/(R1+R2)) \times vo)) = s \times C2 \times vo$$

Deletion of v1 gives:

$$H(s) = (H \times \omega 0/Q \times s)/(s^2 + \omega 0/Q \times s + \omega 0^2) \quad (1)$$

$$\omega 0 = ((gm1 \times gm2)/(C1 \times C2))^{1/2} = gm/C$$

$$Q = \alpha \times ((C2 \times gm1)/(C1 \times gm2))^{1/2} = \alpha$$

$$H = \alpha$$

$$f0 = \omega 0/2\pi = gm/(C \times 2\pi) \quad (2)$$

where:
vin: Input voltage of the BPF 35,
vo: Output voltage of the BPF 35,
i1: Output current of the GM1,
i2: Output current of the GM2,
v1: Output voltage of the GM1,
gm1: Transconductance of the GM1,
gm2: Transconductance of the GM2,
C1: Capacitance of the capacitor C1,
C2: Capacitance of the capacitor C2,
R1: Output impedance of the GM1,
R2: Output impedance of the GM2,
ω0: Natural angular frequency,
H: Gain,
s: Complex number,
f0: Center frequency,
gm=gm1=gm2, and
C=C1=C2.

According to the formula (2), it is understood that the center frequency of the BPF 35 "f0" can be adjusted by transconductances gm1 and gm2 of the transconductance amplifiers GM1 and GM2.

Figure 8:
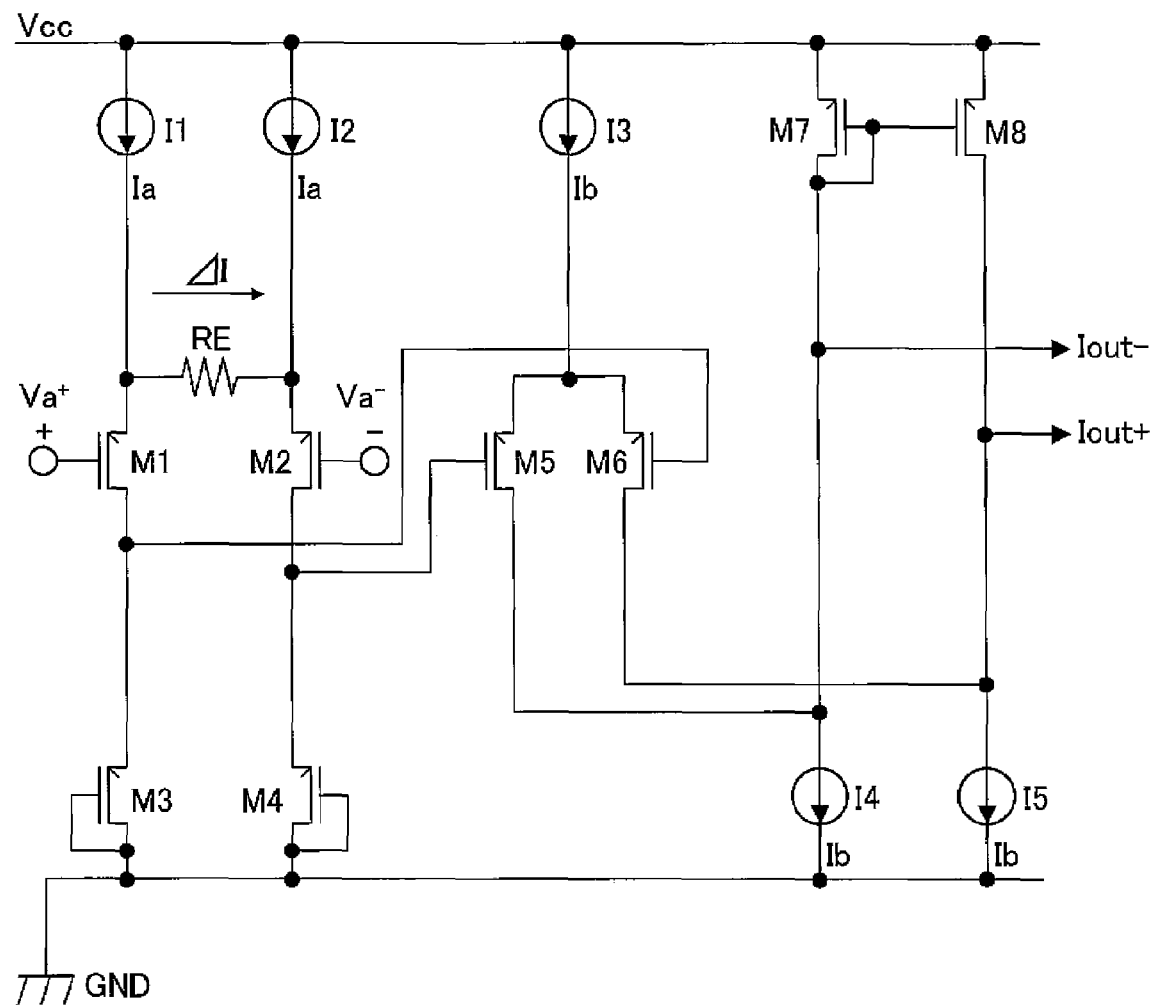
FIG. 8 is a circuit diagram of a transconductance amplifier of the band-pass filter circuit.

FIG. 8 concretely illustrates a circuitry of the transconductance amplifiers GM 1 and GM 2 (referred to as "GM" collectively).

The transconductance amplifier GM includes P-channel MOS transistors M1 through M8, current sources I1 through I5, and a resistor RE.

A source of the transistor M1 is connected to a current source terminal via a current source I1; a source of the transistor M2 is connected to the current source terminal via a current source I2. One end of the resistor RE is connected to the connection point of the source of the transistor M1 and the current source I1; the other end is connected to the connection point of the source of the transistor M2 and the current source I2. The drain of the transistor M1 is connected to the source of the transistor M3; the drain of the transistor M2 is connected to the source of the transistor M4. The gate and the drain of the transistor M3 connected each other are connected to the GND terminal; the gate and the drain of the transistor M4 connected each other are connected to the GND terminal. The gate of the transistor M1 is a noninverting input terminal; the gate of the transistor M2 is an inverting input terminal.

The gate of the transistor M5 is connected to the drain of the transistor M2; the gate of the transistor M6 is connected to the drain of the transistor M1. Each of the sources of transistors M5 and M6 connected each other is connected to the current source terminal via the current source I3.

The transistors M7 and M8 form a current mirror circuit. Each of the sources thereof is connected to the current source terminal. The drain of the transistor M7 is connected to the GND terminal via the current source I4; the drain of the transistor M8 is connected to the GND terminal via the current source I5. The drain of the transistor M5 is connected to the connection point of the drain of the transistor M7 and the current source I4; The drain of the transistor M6 is connected to the connection point of the drain of the transistor M8 and the current source I5. The transconductance amplifier GM outputs output current from the connection point of the drain of the transistor M7 and the current source I4 and the connection point of the drain of the transistor M8 and the current source I5.

In the transconductance amplifier GM with this structure, the transistors M1 through M6 operate in a weak inversion region. A formula for current in the weak inversion region is represented by the formula (3) below.

$$Id = (W/L) \times Ido \times \exp(Vgs/(n \times Vt)) \quad (3)$$

The formula (3) derives:

$$gm = Id/(n \times Vt)$$

$$re = (n \times Vt)/Ia$$

$$\Delta I = 2 \times va/(RE + 2re)$$

where:
Id: Drain current,
W: Channel width,
L: Channel length,
Ido: Parameter of current in the weak inversion region,
Vgs: Voltage between a gate and a source,
n: Subthreshold slope factor,
Vt=k×T/q,
k: Boltzmann constant,
T: Absolute temperature,
q: Elementary charge of an electron,
re: Inverse number of transconductance of a transistor,
Ia: Output current of the current sources I1 and I2,
RE: Resistance of the resistor RE,
ΔI: Current flowing through the resistor RE, and
va: Input voltage of a GM. va=(va$^+$)=−(va$^-$).

By a translinear loop formed by the transistors M3 through M6:

$$Vgs3 + Vgs5 = Vgs4 + Vgs6 \quad (4)$$

$$iout = (Ib/Ia) \times \Delta I$$

$$gm = iout/va$$
$$= 2 \times (Ib/Ia)/(RE + 2 \times ((n \times Vt)/Ia))$$

where:
Ib: Output current of the current sources I4 and I5
iout: Output current of the GM. iout=(iout$^+$)=−(iout$^-$).

According to the formula (4), it is possible to adjust the transconductance gm by controlling an output current value of the current sources I4 and I5: Ib.

According to the formula (4), the center frequency of the BPF 35 "f0" is represented by the formulas below.

$$f0 = gm/(C \times 2\pi) \quad (5)$$
$$= (2 \times (Ib/Ia)/(RE + 2((n \times Vt)/Ia)))/(C \times 2\pi)$$

Therefore, it is possible to adjust the center frequency of the BPF 35 "f0" under control of transconductance of the transconductance amplifier GM "gm" by performing fuse trimming with the current sources I4 and I5 each being any of the reference current source circuits shown in the embodiments 1 through 4. With the reference current source circuits of the embodiments 1 through 4, it is possible to perform correct fuse trimming and thus raise a nondefective ratio. The reference current source circuit 10b which enables more correct fuse trimming is suitably applicable to the infrared remote control receiver due to its strict characteristics.

Figure 9:
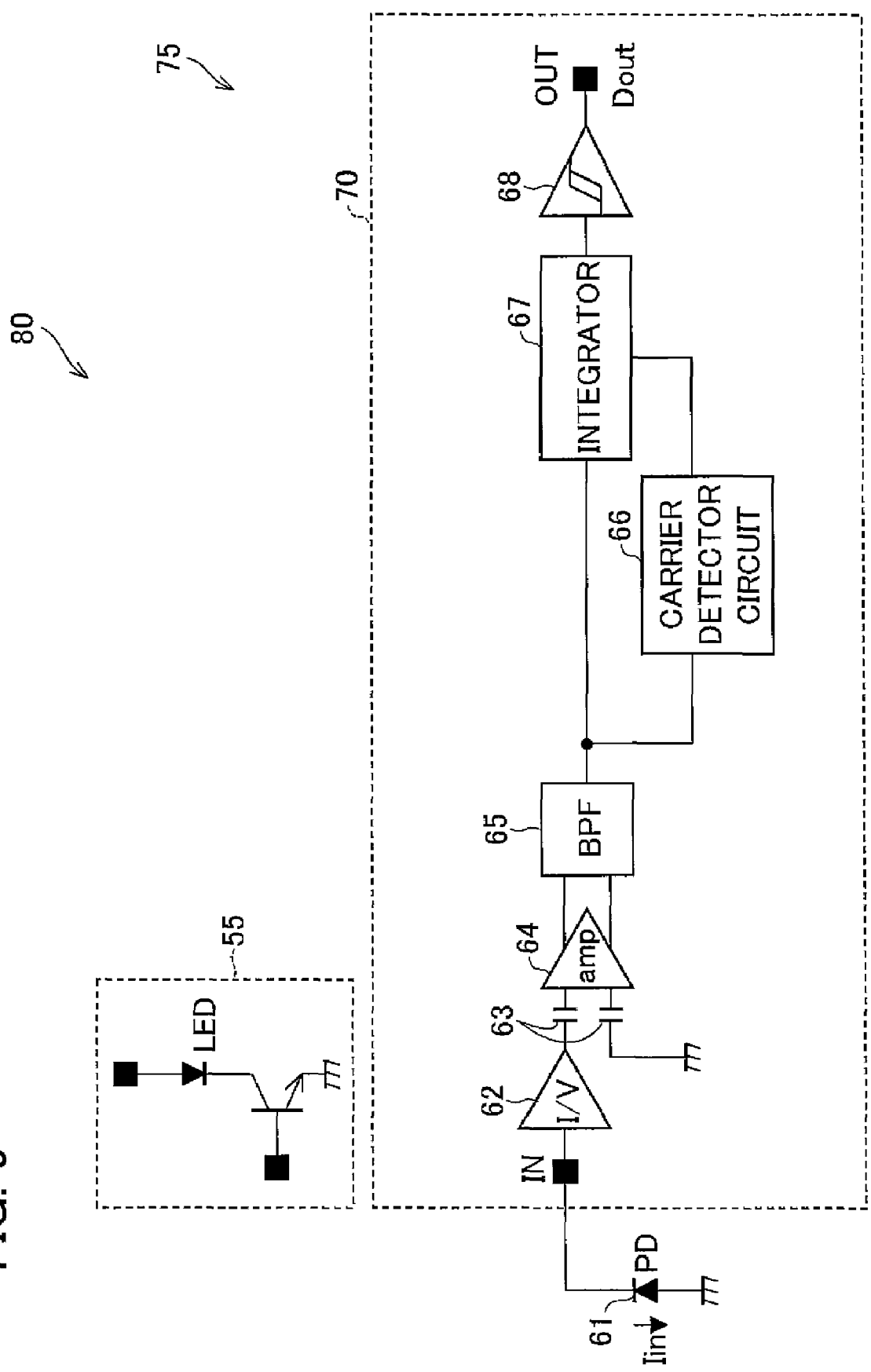
FIG. 9 is a circuit diagram of an IrDA Control transmitter-receiver of still yet another embodiment of the present invention.
Figure 10:
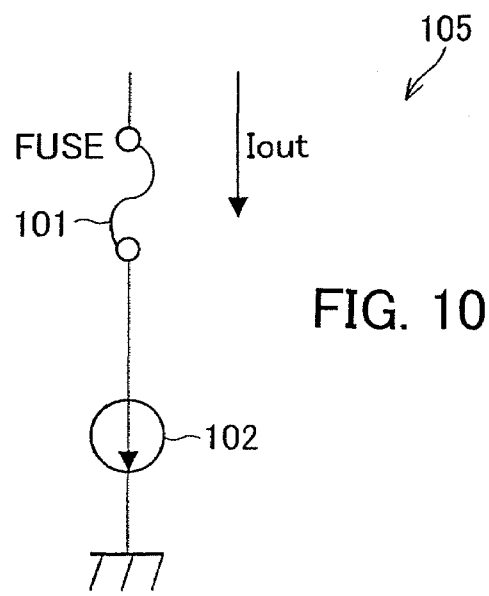
FIG. 10 is a circuit diagram of a reference current source circuit of a conventional art.
Figure 11:
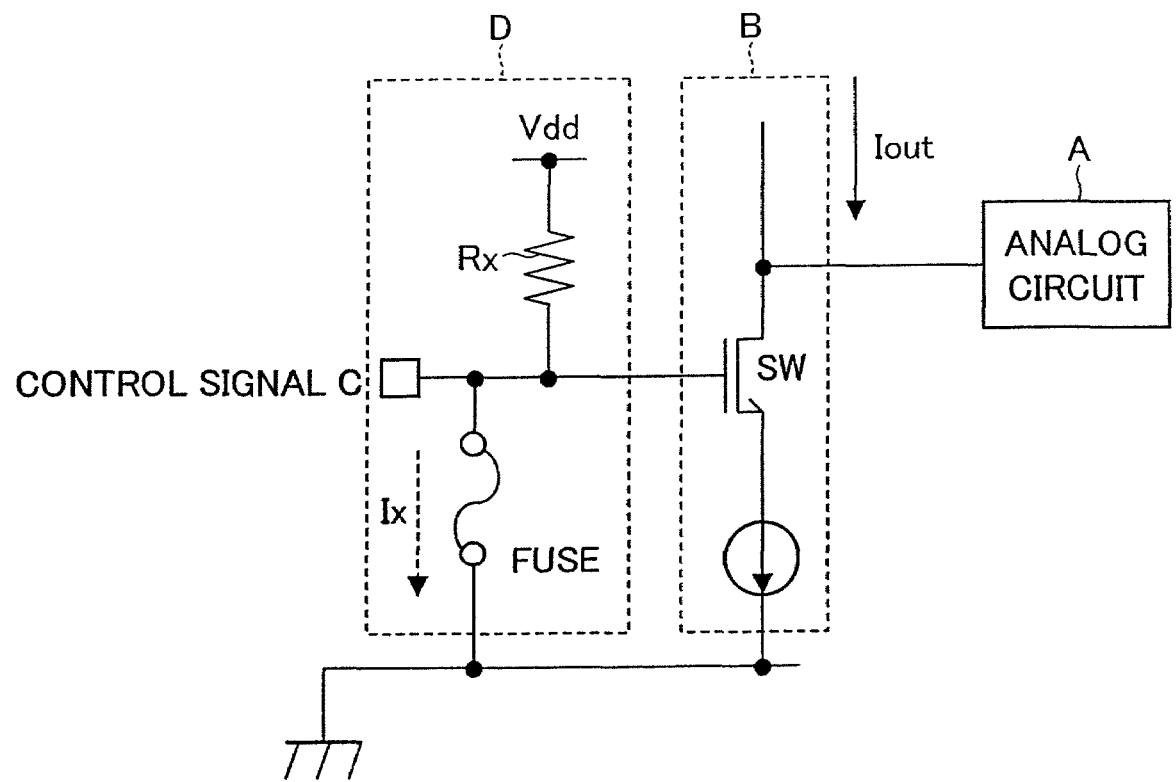
FIG. 11 is a circuit diagram of another reference current source circuit of a conventional art.
Figure 12:
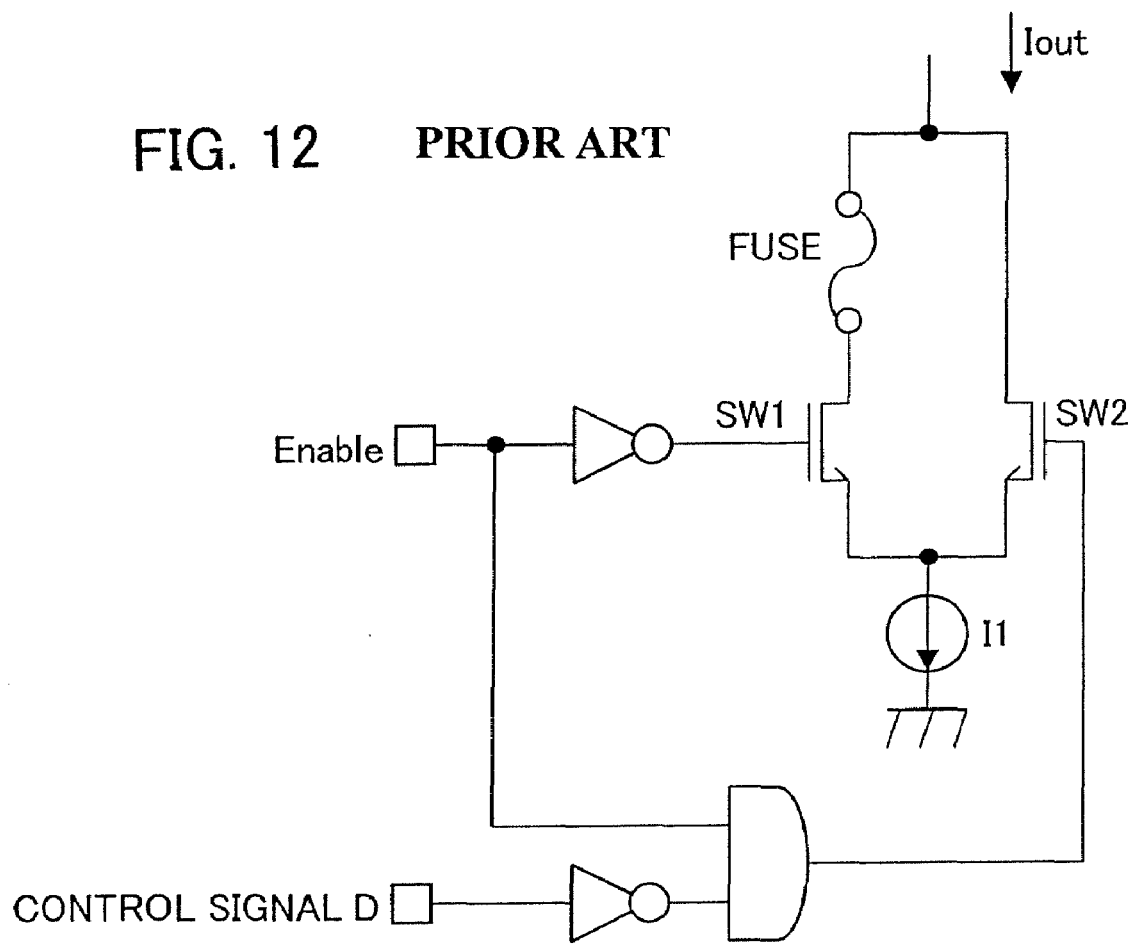
FIG. 12 is a circuit diagram of still another reference current source circuit of a conventional art.

FIG. 9 illustrates a circuitry of an IrDA Control transmitter-receiver 80.

The IrDA Control transmitter-receiver 80 is provided with a transmitting section 55 and a receiving section 75 for two-way communication. The transmitting section 55 is provided with an LED and a driving circuit thereof. The structure of the receiving section 75 is the same as the infrared remote control receiver 50. The receiving section 75 includes a photodiode chip 61 and a receiving chip 70 having a current-voltage converter circuit 62, a capacitor 63, an amplifier circuit 64, a BPF 65, a carrier detector circuit 66, an integrating circuit 67, and a hysteresis comparator 68. The receiving section 75 demodulates a signal transferred from the transmitting section and sends the signal to a microcomputer etc. which control electronic devices.

With regard to the IrDA Control transmitter-receiver 80, as well as the infrared remote control receiver 50, it is possible to adjust the center frequency of the BPF 65. With the reference current source circuits of the embodiments 1 through 4, it is possible to perform correct fuse trimming and thus raise a nondefective ratio.

Each of the reference current source circuits of the embodiments may be provided with a plurality of current source circuits whose output currents are different from each other. The plurality of current source circuits may be selectable for use.

According to the arrangement, the reference current source circuit makes it possible to adjust characteristics of a semiconductor integrated circuit more correctly because it is possible to widely control an output current value of the reference current source circuit and seek an appropriate output current value due to the plurality of selectable current source circuits whose output currents are different from each other.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A reference current source circuit for performing fuse trimming, comprising:
   a current source circuit;
   a trimming fuse;
   a switching circuit for connecting the current source circuit to the trimming fuse upon receipt of an inputted signal at a predetermined level, and disconnecting the current source circuit from the trimming fuse upon receipt of the inputted signal at a different level from the predetermined level;
a control circuit including a plurality of input terminals, for controlling the operation of the switching circuit by generating a signal at the predetermined level or the different level from the predetermined level in accordance with a test control signal inputted into the plurality of input terminals and inputting the generated signal into the switching circuit; and
a resistive element connecting at least one of the plurality of input terminals of the control circuit to a positive current source terminal or a negative current source terminal,
the control circuit controlling the operation of the switching circuit by generating the signal at the predetermined level in accordance with a signal of the input terminal connected to the resistive element.

2. A reference current source circuit unit comprising:
a plurality of reference current source circuits each of which includes:
  a current source circuit;
  a trimming fuse;
  a switching circuit for connecting the current source circuit to the trimming fuse upon receipt of an inputted signal at a predetermined level, and disconnecting the current source circuit from the trimming fuse upon receipt of the inputted signal at a different level from the predetermined level;
  a control circuit including a plurality of input terminals, for controlling the operation of the switching circuit by generating a signal at the predetermined level or the different level from the predetermined level in accordance with a test control signal inputted into the plurality of input terminals and inputting the generated signal into the switching circuit; and
  a resistive element connecting at least one of the plurality of input terminals of the control circuit to a positive current source terminal or a negative current source terminal, the control circuit controlling the operation of the switching circuit by generating the signal at the predetermined level in accordance with a signal of the input terminal connected to the resistive element,
respective current source circuits, whose output currents are different from each other, of the plurality of reference current source circuits,
the respective current source circuits being selectable for use.

3. An infrared signal processing circuit, comprising:
a reference current source circuit; and
a circuit, which is fuse-trimmed by the reference current source circuit, the reference current source circuit including:
a current source circuit;
a trimming fuse;
a switching circuit for connecting the current source circuit to the trimming fuse upon receipt of an inputted signal at a predetermined level, and disconnecting the current source circuit from the trimming fuse upon receipt of the inputted signal at a different level from the predetermined level;
a control circuit, including a plurality of input terminals, for controlling the operation of the switching circuit, by generating a signal at the predetermined level or the different level from the predetermined level in accordance with a test control signal inputted into the plurality of input terminals and inputting the generated signal into the switching circuit; and
a resistive element connecting at least one of the plurality of input terminals of the control circuit to a positive current source terminal or a negative current source terminal,
the control circuit controlling the operation of the switching circuit by generating the signal at the predetermined level in accordance with a signal of the input terminal connected to the resistive element.

4. An infrared signal processing circuit unit, comprising:
a plurality of infrared signal processing circuits each of which includes:
  a reference current source circuit; and
  a circuit, which is fuse-trimmed by the reference current source circuit,
  the reference current source circuit including:
    a current source circuit;
    a trimming fuse;
    a switching circuit for connecting the current source circuit to the trimming fuse upon receipt of an inputted signal at a predetermined level, and disconnecting the current source circuit from the trimming fuse upon receipt of the inputted signal at a different level from the predetermined level;
    a control circuit, including a plurality of input terminals, for controlling the operation of the switching circuit, by generating a signal at the predetermined level or the different level from the predetermined level in accordance with a test control signal inputted into the plurality of input terminals and inputting the generated signal into the switching circuit; and
    a resistive element connecting at least one of the plurality of input terminals of the control circuit to a positive current source terminal or a negative current source terminal, the control circuit controlling the operation of the switching circuit by generating the signal at the predetermined level in accordance with a signal of the input terminal connected to the resistive element,
respective current source circuits, whose output currents are different from each other, of the plurality of infrared signal processing circuits,
the respective current source circuits being selectable for use.

* * * * *